(12) United States Patent
Lee

(10) Patent No.: US 7,256,562 B2
(45) Date of Patent: Aug. 14, 2007

(54) CONTROL CIRCUIT FOR A COOLING FAN

(75) Inventor: Byong-Jeon Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/280,299

(22) Filed: Nov. 17, 2005

(65) Prior Publication Data

US 2006/0109627 A1 May 25, 2006

(30) Foreign Application Priority Data

Nov. 25, 2004 (KR) ...................... 10-2004-0097687

(51) Int. Cl.
*H02P 3/00* (2006.01)
*H02P 7/00* (2006.01)

(52) U.S. Cl. ...................... 318/268; 318/471; 318/472; 318/473

(58) Field of Classification Search ................ 318/268, 318/471–473
See application file for complete search history.

(56) References Cited

U.S. PATENT DOCUMENTS 5,718,373 A * 2/1998 Kim et al. .................... 236/35
6,291,956 B1 * 9/2001 Ku .............................. 318/445
6,407,525 B1 * 6/2002 Horng et al. ................ 318/473
7,038,415 B2 * 5/2006 Nakamura et al. .......... 318/471

* cited by examiner

*Primary Examiner*—Lincoln Donovan
*Assistant Examiner*—Tyrone Smith
(74) *Attorney, Agent, or Firm*—Roylance, Abrams, Berdo & Goodman, L.L.P.

(57) ABSTRACT

A control circuit for a cooling fan is provided that adjusts input power and drive a cooling fan. The control circuit comprises a temperature detector for detecting temperature; a power controller for controlling driving power to the cooling fan based on the input power and supplying the driving power; a proportional electric power block supplying control power proportional to temperature variation of the detected; and a fixed electric power block supplying control power at a fixed level when the detected temperature is lower than a predetermined level. The control circuit for a cooling fan is configured to detect temperature variation and to operate with less noise by controlling rotational velocity of the cooling fan in proportion to variation in temperature variation to reduce noise generated when operating the cooling fan.

8 Claims, 5 Drawing Sheets

CONTROL CIRCUIT FOR A COOLING FAN

PRIORITY

This application claims the benefit under 35 U.S.C. § 119(a) of Korean Patent Application No. 2004-0097687, filed Nov. 25, 2004 in the Korean Intellectual Property Office, the entire disclosure of which is hereby incorporated by reference.

BACKGROUND OF THE INVENTION

1. Field of the Invention

The present invention relates to a control circuit for a cooling fan. More particularly, the present invention relates to a control circuit for a cooling fan that detects variation in temperature and controls the cooling fan's rotational velocity.

2. Description of the Related Art

Various electrical and electronic devices employ a cooling fan to cool heat generated by the devices when they operate. Such devices typically consist of information processors such as a computer, office automation (OA) appliances, home electronic appliances, electric power equipment, and so on. Typically, the motor shaft rotation rate and the cooling fan airflow rate are determined in consideration of the expected temperature of the device. Thus, the cooling fan is designed to operate at a predetermined velocity. Such a static velocity profile, however, results in lower cooling efficiency and an increase in noise in general.

To improve the problems with efficiency and noise, conventional cooling fan control circuits are designed to change the cooling fan driving velocity according to variations in temperature, as shown in FIG. 4.

The conventional cooling fan control circuit shown in FIG. 4 consists of a temperature detector made of a thermistor TH for detecting temperature and temperature compensation resistors R1 and R2; comparators COM 1 and COM 2 having as input the detecting voltage which changes according to variation in temperature and connected to the noninverting terminal and a predetermined standard voltage connected to the inverting terminal; and a switch TR for applying the input voltage to the cooling fan as a function of comparator output.

In the conventional control circuit of FIG. 4, the cooling fan is driven at a low velocity—predetermined rotation number (a)—to reach temperature t1 (FIG. 5) even though the resistance value of thermistor TH changes in response to the temperature variation. Each of the comparators COM1 and COM2 is prevented from operating and the switch TR maintains a disabled state until the temperature detected by the temperature detector reaches the predetermined level t1 (FIG. 5). The input electric power +Vcc causes current to flow through output resistor R5 and maintains the predetermined rotation number (a) by supplying a predetermined voltage to the cooling fan.

When the temperature reaches a first level t1, the resistance value of the thermistor TH is lowered and the voltage at the input of the noninverting terminal of comparator COM 1 increases. Similarly, the voltage is divided by the temperature compensation resistors R1 and R2 so that the voltage at the noninverting terminal of comparator COM2 increases as well. Voltages at the noninverting terminals of COM1 and COM2 vary relative to the standard voltage divided across resistor R4 and provided as input to the inverting terminals of COM 1 and COM2. Accordingly, as comparator COM 1 operates, base electric current of the switch TR increases, and a first output voltage provided by the collector terminal supplies electric power to the cooling fan. As a result of the increase in temperature, and corresponding increase in voltage to the cooling fan, the first output voltage maintains a predetermined rotation number (b), which is an increase from the previous rotation number due to the higher voltage, relative to the distribution voltage supplied by output resistor R5.

If the temperature increases from the first level t1 to a second level t2, the voltage input to comparator COM 2 rises relative to the voltage distributed to the temperature compensation resistor R2 at the first temperature level t1. As comparator COM2 operates, the base current of switch TR increases. The output from the collector is higher for the second temperature level t2 than for the first temperature level t1 and is supplied to the cooling fan. Accordingly, as the comparator COM 2 operates, the rotation number of the cooling fan maintains a predetermined rotation number (c), which is an increase from the previous rotation number (b) caused by the second output voltage due to operation of comparator COM 1.

Thus, the control circuit of the cooling fan in FIG. 4 variably controls the rotation of the cooling fan according to variation in temperature. However, as shown on the graph in FIG. 5, the rotation of the fan drastically changes from (a) to (b) to (c) in response to temperature increase. This in turn requires an increase in the output voltage supplied to the cooling fan, which increases the amount of noise generated by the cooling fan.

SUMMARY OF THE INVENTION

Aspects of the present invention provide a control circuit for a cooling fan that detects variation in temperature, operates with less noise, and controls rotational velocity of the cooling fan in proportion to the temperature variation, thereby lowering the noise generated when operating the cooling fan.

The foregoing and other aspects of the present invention are achieved by providing a control circuit for a cooling fan that adjusts input power and controls driving a cooling fan. The control circuit comprises a temperature detector for detecting a temperature; a power controller for controlling power to drive the cooling fan by a predetermined amount of control power on the basis of the input power and outputting the driving power; a proportional electric power block for applying control power proportional to temperature variation of the detected temperature to the power controller; and a fixed electric power block for applying control power at a fixed level to the power controller for when the detected temperature is lower than a predetermined level.

According to an aspect of the present invention, the proportional electric power supply applies control power in proportion to variation in temperature when the temperature detected is higher than a predetermined level.

According to another aspect of the present invention, the fixed electric power supply is provided between the proportional electric power supply and the cooling fan, and comprises a first comparator applying control power at a fixed level to the power controller on the basis of a predetermined offset input voltage.

According to an aspect of the present invention, the temperature detector comprises a thermistor connected to the input power and detecting variation in temperature, and a compensation resistor connected in series with the thermistor and supplying a compensation voltage according to the temperature variation. Proportional electric power is provided between the input power and the power controller, and comprises a pair of voltage division resistors provided in parallel with the temperature detector and providing a predetermined standard voltage. The temperature detector further comprises a second comparator for comparing a compensation voltage according to variation in temperature as provided by the temperature detector with the standard voltage, and applying control power in proportion to a difference voltage according to the difference resulted from the comparison to the power controller.

According to another aspect of the present invention, the standard voltage is set up at a level higher than the offset input voltage.

According to another aspect of the present invention, the power controller comprises a switch element having an input terminal connected to the input power; an output terminal for outputting driving power to the cooling fan; and a control terminal supplied with control power.

BRIEF DESCRIPTION OF THE DRAWINGS

The above and other aspects, features, and advantages of the present invention will become more apparent from the following detailed description of certain exemplary embodiments with reference to the accompany drawings, in which.

Throughout the drawings, like reference numbers should be understood to refer to like elements, features, and structures.

DETAILED DESCRIPTION OF EXEMPLARY EMBODIMENTS

The matters exemplified in this description are provided to assist in a comprehensive understanding of various exemplary embodiments of the present invention disclosed with reference to the accompanying figures. Accordingly, those of ordinary skill in the art will recognize that various changes and modifications of the exemplary embodiments described herein can be made without departing from the scope and spirit of the claimed invention. Descriptions of well-known functions and constructions are omitted for clarity and conciseness.

Figure 1:
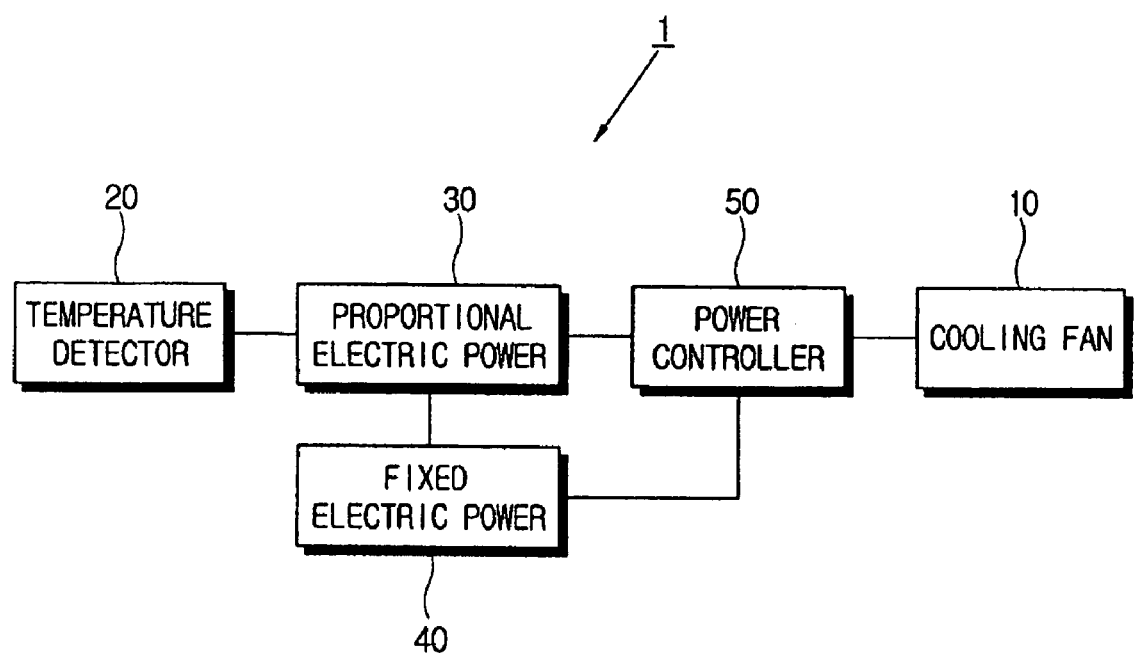
FIG. 1 is a schematic block diagram of a control circuit for a cooling fan according an exemplary embodiment of the present invention.

FIG. 1 illustrates a schematic configuration of a control circuit for a cooling fan according to an exemplary embodiment of the present invention.

In reference to FIG. 1, a control circuit 1 of a cooling fan according to an exemplary embodiment of the present invention controls operation of a cooling fan 10 by adjusting input electric power. The control circuit 1 comprises a temperature detector 20 for detecting temperature; a proportional electric power block 30 for applying control power in proportion to the temperature variation detected by temperature detector 20; a fixed electric power block 40 for applying control power at a fixed level when the temperature detected by temperature detector 20 is below a predetermined level; and a power controller 50 for controlling power to drive cooling fan 10 by the control power applied from the proportional electric power block 30 and the fixed electric power block 40 based on the input power. A driving motor for driving cooling fan 10 is not shown.

Figure 2:
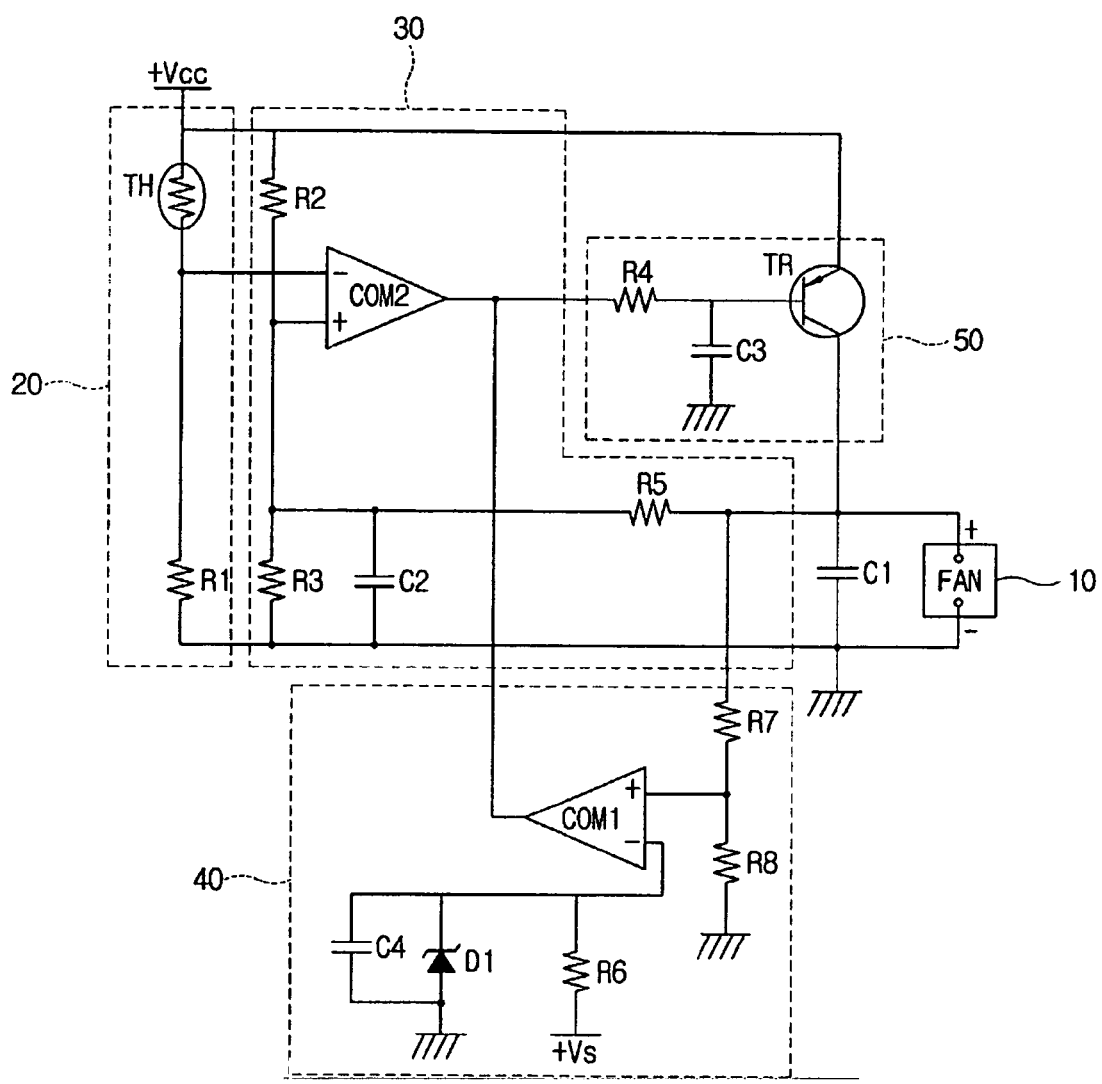
FIG. 2 illustrates a circuit configuration of the control circuit for a cooling fan according to an exemplary embodiment of the present invention.

In reference to FIG. 2, fixed electric power block 40 is provided between the proportional electric power block 30 and the cooling fan 10. The fixed electric power block 40 may comprise a first comparator COM 1 for applying control power at a fixed level to the power controller 50 on the basis of a predetermined offset input voltage. That is, the fixed electric power block 40 causes the cooling fan 10 to rotate at a predetermined fixed number by supplying a predetermined driving power from the power controller 50 regardless of the temperature variation detected by the temperature detector 20.

Proportional electric power block 30 supplies control power proportional to variation in temperature to the power controller 50 if the temperature detected by temperature detector 20 is higher than a predetermined temperature. On the temperature section A (FIG. 3), where the detected temperature reaches the first level T1, the first driving power supplied by the power controller 50 by the control power supplied from fixed electric power block 40 uniformly maintains a low voltage level, and the cooling fan 10 operates in a low noise mode.

On the temperature section B (FIG. 3), where the detected temperature rises higher than the first level T1 and proportionally increases, the second driving power supplied by the power controller 50 by the control power supplied by the proportional electric power block 30 proportionally increases with respect to variation in temperature, and the rotation of the cooling fan 10 increases proportionally. Accordingly, the rotation of the cooling fan 10 is not drastically changed according to the temperature variation, thereby reducing noise due to sudden increase in rotational speed.

Figure 3:
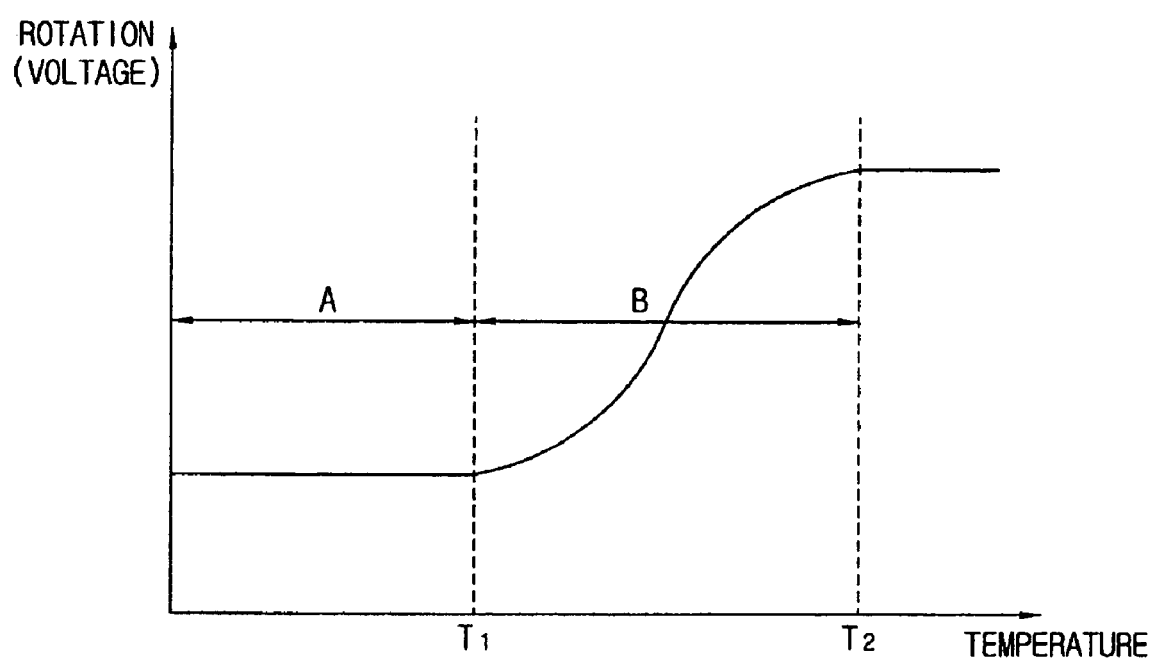
FIG. 3 is a graph of an operating state of the cooling fan according to an exemplary embodiment of the present invention.
Figure 4:
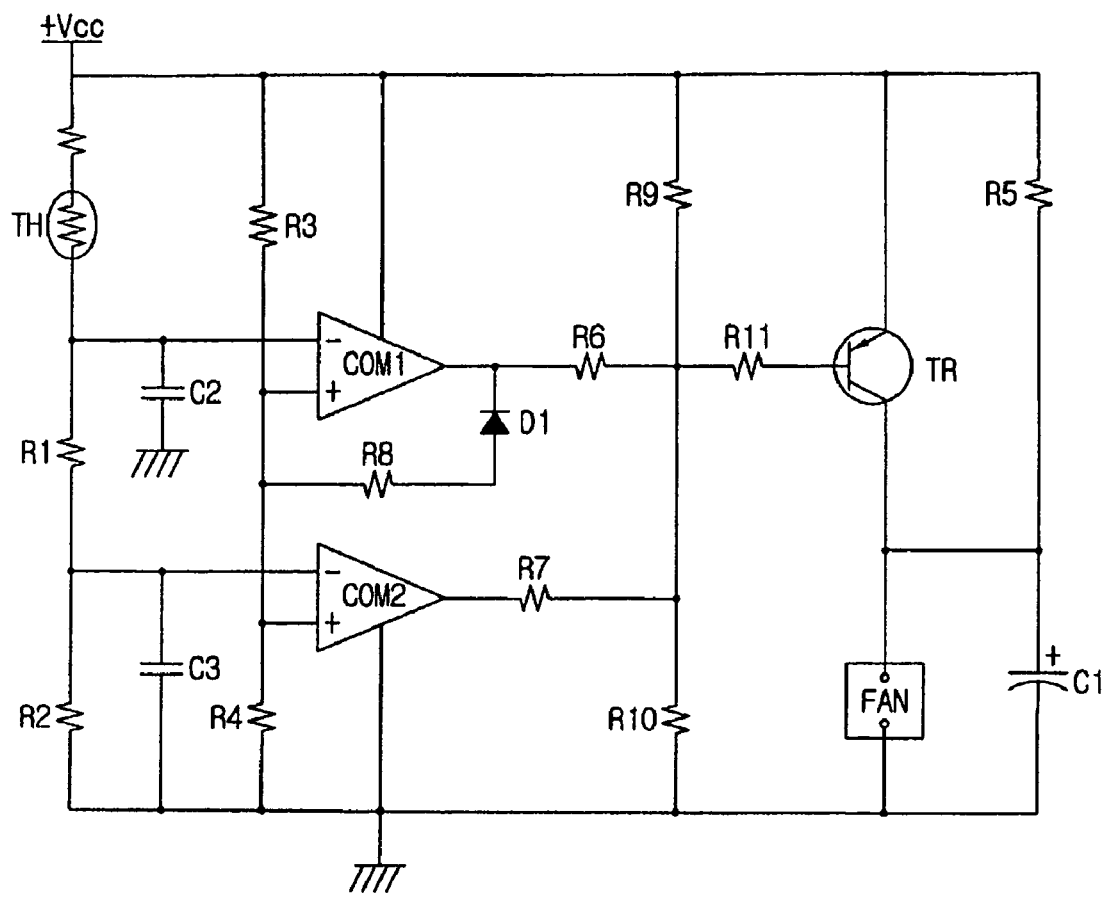
FIG. 4 illustrates a circuit configuration of a conventional control circuit of the cooling fan.
Figure 5:
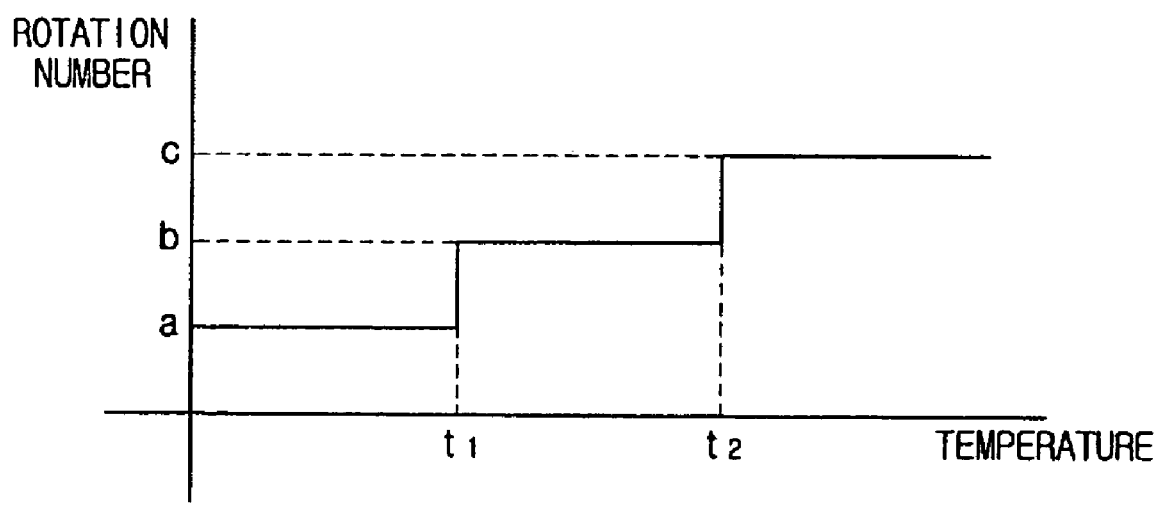
FIG. 5 is a graph of an operating state of a conventional control circuit of the cooling fan.

In reference to the graph shown in FIG. 3, if the detected temperature rises to a level higher than that of temperature section B, the rotation of cooling fan 10 is uniformly maintained. At this temperature level, the cooling fan 10 operates at the highest driving power according to the design value of the device described by this exemplary embodiment.

Referring to FIG. 2, each element of the control circuit 1 of the cooling fan according to an exemplary embodiment of the present invention will be described.

Temperature detector 20 comprises a thermistor TH connected to input power +Vcc and is configured to detect variation in temperature; and a compensation resistor R1 of which a first end is connected to thermistor TH in series and a second end is connected to ground. Resistor R1 provides compensation voltage according to the temperature variation. The thermistor TH may be provided as a thermistor comprising negative temperature coefficient (NTC), in which a detected temperature and a resistance value are reciprocally proportional. As the temperature detected from the thermistor TH rises, the resistance value of the thermistor TH drops, thereby increasing the compensation voltage distributed to the compensation resistor R1.

The proportional electric power block 30 is provided between the input power +Vcc and the power controller 50, and receives a compensation voltage from the temperature detector 20. That is, the proportional electric power block 30 comprises a pair of voltage division resistors R2 and R3 connected with each other in series to provide a predetermined standard voltage. Resistors R2 and R3 are provided in parallel with the thermistor TH and the compensation resistor R1 of the temperature detector 20. The proportional electric power block 30 further comprises a second comparator COM 2 on which a noninverting terminal is connected to a node between the thermistor TH and the compensation resistor R1. The inverting terminal of second comparator COM 2 is connected to a node between the pair of voltage division resistors R2 and R3. A return resistor R5 is connected in parallel with the voltage division resistor R3 of the standard voltage between the inverting terminal applied with the standard voltage of the second comparator COM 2 and an output terminal of a switch element TR (to be described later).

The second comparator COM 2 is supplied with a compensation voltage according to the temperature variation detected by temperature detector 20 and the standard voltage supplied by the voltage division resistors R2 and R3. The second comparator COM 2 supplies the control power to power controller 50 in proportion to a difference voltage according to a comparison of the compensation voltage and the standard voltage. Also, the second comparator COM 2 operates after the detected voltage supplied to the noninverting terminal reaches a predetermined level. That is, after the temperature detected by the thermistor TH reaches a predetermined first level T1 and outputs the control power consecutively increasing/decreasing as the temperature variation increases/decreases.

The output of first comparator COM 1 in fixed electric power block 40 is connected to the control terminal of switch element TR (to be described later). The inverting terminal of the input part to first comparator COM 1 is connected to the node of the pair of distribution resistors R7 and R8 to provide the standard voltage. Further, the predetermined offset input voltage +Vs is applied to a noninverting terminal of first comparator COM 1 through offset resistor R6. A capacitor C4 serving to restrain noise, and zener diode D1 serves to prevent excessive voltage backflow. C4 and D1 are connected to the noninverting terminal of the first comparator COM 1 and ground.

Accordingly, the proportional electric power block 30 does not operate when the temperature detected by the temperature detector 20 of the control circuit 1 of the cooling fan is at level A. When the temperature is at level A, the fixed electric power block 40 maintains the base current of switch element TR provided in power controller 50 at a constant value determined by offset input voltage +Vs supplied to the first comparator COM 1. Thus, the driving power supplied to the cooling fan 10 through the switch element TR maintains a constant voltage level and the fan rotates at a constant velocity. In this mode of operation, the voltage level of the driving power applied to the cooling fan 10 is equivalent to a distribution voltage distributed to serial composition resistor of the distribution resistors R7 and R8 connected to the noninverting terminal of the first comparator COM 1.

The offset input voltage Vs supplied to the first comparator COM 1 may be set at a voltage level equivalent to or lower than the standard voltage supplied to the noninverting terminal of the second comparator COM 2 via the voltage division resistor R3. Alternatively, the offset input voltage Vs supplied to the first comparator COM 1 may be set to be higher than the standard voltage supplied to the noninverting terminal of the second comparator COM 2 via the voltage division resistor R3.

Power controller 50 of the control circuit 1 of the cooling fan according to an exemplary embodiment of the present invention comprises switch element TR connected between the input power +Vcc and a first input terminal of cooling fan 10. A current limiting resistor R4 restrains the base current and is connected to the control terminal of the switch element TR of the power controller 50.

The switch element TR supplies an emitter port as the input terminal connected to the input power +Vcc, a collector port as the output terminal connected to the cooling fan 10, and a base port as the control terminal connected to the output of first comparator COM 1 of the fixed electric power block 40 and the output of second comparator COM 2 of the proportional electric power block 30.

As the control terminal of switch element TR, shown as a PNP-type device in FIG. 2, controls variation of the base current, the output voltage from the collector port as the output terminal increases proportionally by the input voltage supplied by the emitter port as the input terminal and is supplied as the driving power of the cooling fan 10.

The power controller 50 supplies driving power to cooling fan 10 at a predetermined level in response to control power supplied from the fixed electric power block 40 until a predetermined first temperature level T1 is reached. When the temperature detected by thermistor TH of temperature detector 20 reaches a second level T2, being an increase from the first level T1, the cooling fan is supplied with driving power from the proportional electric power block 30 in proportion to the temperature variation increasing or decreasing.

In the foregoing exemplary embodiment, switch element TR of the power controller 50 is provided as a PNP type. Alternatively, switch element TR may be provided as an NPN type. Additionally, the polarity of the input terminals of first comparator COM1 and second comparator COM 2 may be differently set.

Each of the comparators COM 1 and COM 2 may be realized by using an operational (OP) amplifier, a 339 Quad Comparator, or any comparator known to those in the art.

While the present invention has been particularly shown and described with reference to certain exemplary embodiments thereof, it will be understood by those of ordinary skill in the art that various changes in form and detail may be made therein without departing from the spirit and scope of the present invention as defined by the appended claims.

What is claimed is:

1. A control circuit for a cooling fan, comprising:
    a temperature detector for detecting temperature variation;
    a power controller for controlling driving power to the cooling fan;
    a proportional electric power block for supplying control power to the power controller in proportion to variation in temperature; and
    a fixed electric power block for supplying control power to the power controller at a fixed level when the detected temperature is lower than a predetermined temperature,
    wherein the fixed electric power block is provided between the proportional electric power block and the cooling fan, the fixed electrical power block comprising a first comparator for supplying power at a fixed level to the power controller on the basis of a predetermined offset input voltage, and
    wherein the temperature detector comprises a thermistor connected to an input power source and configured to detect variation in temperature, and a compensation resistor connected in series with the thermistor and configured to supply a compensation voltage according to the temperature variation, wherein the proportional electric power block is provided on a bypath between the input power and the power controller, and comprises a pair of voltage division resistors provided in parallel with the temperature detector and providing a predetermined standard voltage; and a second comparator for comparing the compensation voltage according to the temperature variation of the temperature detector and the standard voltage, and applying the control power proportional to a difference voltage according to a difference resulted from comparison to the power controller.

2. The control circuit according to claim 1, wherein the proportional electric power block supplies control power when the temperature detected is higher than the predetermined levels.

3. The control circuit according to claim 1, wherein the standard voltage is set at a level higher than the offset input voltage.

4. The control circuit according to claim 1, wherein the power controller comprises a switch element having an input terminal connected to an input power source; an output terminal for supplying power to drive the cooling fan; and a control terminal for receiving the control power.

5. The control circuit according to claim 2, wherein the power controller comprises a switch element having an input terminal connected to an input power source; an output terminal for supplying power to drive the cooling fan; and a control terminal for receiving the control power.

6. The control circuit according to claim 1, wherein the power controller comprises a switch element having an input terminal connected to an input power source; an output terminal for supplying power to drive the cooling fan; and a control terminal for receiving the control power.

7. The control circuit according to claim 1, wherein the power controller comprises a switch element having an input terminal connected to the input power source; an output terminal for supplying power to drive the cooling fan; and a control terminal for receiving the control power.

8. The control circuit according to claim 3, wherein the power controller comprises a switch element having an input terminal connected to the input power source; an output terminal for supplying power to drive the cooling fan; and a control terminal for receiving the control power.

* * * * *